(12) United States Patent
Chung

(10) Patent No.: US 6,288,905 B1
(45) Date of Patent: Sep. 11, 2001

(54) CONTACT MODULE, AS FOR A SMART CARD, AND METHOD FOR MAKING SAME

(75) Inventor: Kevin Kwong-Tai Chung, Princeton, NJ (US)

(73) Assignee: Amerasia International Technology Inc., Princeton Junction, NJ (US)

( * ) Notice: Subject to any disclaimer, the term of this patent is extended or adjusted under 35 U.S.C. 154(b) by 0 days.

(21) Appl. No.: 09/412,052

(22) Filed: Oct. 4, 1999

Related U.S. Application Data

(60) Provisional application No. 60/141,344, filed on Jun. 28, 1999, provisional application No. 60/134,656, filed on May 18, 1999, provisional application No. 60/131,377, filed on Apr. 28, 1999, and provisional application No. 60/129,497, filed on Apr. 15, 1999.

(51) Int. Cl.[7] .............................. H05K 7/06; H01L 23/14
(52) U.S. Cl. ..................... 361/771; 361/748; 361/760; 361/767; 361/768; 361/783; 174/256; 174/257; 174/258; 174/259; 174/260; 174/262; 174/264; 257/668; 257/679; 257/778; 257/787; 438/118; 438/119; 438/125; 438/126; 29/830; 29/832; 29/841
(58) Field of Search ..................... 361/737, 782, 361/783, 792, 795, 748, 750, 751, 760, 767, 768, 771; 235/488, 492; 174/255, 258, 259, 262, 264, 256, 260, 257; 257/679, 668, 778, 787; 340/572.8; 29/830–832, 841, 852, 855; 438/118, 119, 108, 126, 127, 125

(56) References Cited

U.S. PATENT DOCUMENTS

| | | | |
|---|---|---|---|
| 4,498,122 | * | 2/1985 | Rainal ................................. 174/264 |
| 4,628,406 | * | 12/1986 | Smith et al. ......................... 29/832 |
| 4,874,721 | * | 10/1989 | Kimura et al. ...................... 29/830 |
| 5,073,840 | * | 12/1991 | Coors .................................. 174/255 |
| 5,147,210 | * | 9/1992 | Patterson et al. .................... 29/830 |

(List continued on next page.)

OTHER PUBLICATIONS

Dr. Elke Zakel, "Smart Cards—An Overview", *IEEE,—Second Workshop on Smart Card Technologies and Applications*, Berlin, Nov. 16–18, 1998.

Jorge Vieira da Silva, Contact Less Smart Cards: European applications, co–operative developments and industrial supply environment, *IEEE Second Workshop on Smart Card Technologies and pplications, Berlin Nov. 16–18, 1998*; 18 pages.

(List continued on next page.)

*Primary Examiner*—Jayprakash N. Gandhi
*Assistant Examiner*—John B. Vigushin
(74) *Attorney, Agent, or Firm*—Dann, Dorfman, Herrell and Skillman, P.C.

(57) ABSTRACT

A module, such as a contact module for embedding an electronic device into a credit card, smart card, identification tag or other article, comprise a pattern of metal contacts having a first and a second surface and electrically-conductive vias built up on the first surface of the metal contacts. A layer of dielectric adhesive on the first surface of the pattern of metal contacts surrounds the electrically-conductive vias except the ends thereof distal from the metal contacts. An electronic device has electrical contacts connected to the exposed ends of the conductive vias, as by wire bonds or by flip-chip type connections. The module is preferably made by forming a pattern of conductive vias on the first surface of a sheet of electrical contact material, the pattern of vias corresponding to the pattern of contacts of an electronic device; applying dielectric adhesive on the first surface of the sheet of electrical material except in locations corresponding to the vias; patterning the sheet of electrical material to define a pattern of electrical contacts thereon, wherein ones of the electrical contacts are associated with at least corresponding ones of the vias; and attaching the electronic device with the contacts of the electronic device electrically connected to corresponding vias.

49 Claims, 9 Drawing Sheets

U.S. PATENT DOCUMENTS

| | | | |
|---|---|---|---|
| 5,399,903 | * | 3/1995 | Rostoker et al. .................... 257/668 |
| 5,430,441 | | 7/1995 | Bickley et al. . |
| 5,450,290 | * | 9/1995 | Boyko et al. ........................ 361/792 |
| 5,463,404 | | 10/1995 | Wall . |
| 5,473,118 | * | 12/1995 | Fukutake et al. ................... 174/258 |
| 5,514,475 | * | 5/1996 | Nawa et al. ......................... 361/750 |
| 5,574,470 | | 11/1996 | de Vall . |
| 5,598,032 | | 1/1997 | Fidalgo ............................... 257/679 |
| 5,637,920 | * | 6/1997 | Loo ...................................... 361/750 |
| 5,677,246 | * | 10/1997 | Maeta et al. ........................ 438/118 |
| 5,740,606 | * | 4/1998 | Rose ..................................... 235/492 |
| 5,751,256 | | 5/1998 | McDonough et al. .............. 343/873 |
| 5,847,931 | | 12/1998 | Gaumet et al. . |
| 5,880,934 | | 3/1999 | Haghiri-Tehrani . |
| 5,892,661 | | 4/1999 | Stafford et al. . |
| 5,906,042 | * | 5/1999 | Lan et al. .............................. 29/852 |
| 5,909,050 | | 6/1999 | Furey et al. . |
| 5,915,753 | * | 6/1999 | Motomura et al. .................... 29/830 |
| 5,926,696 | * | 7/1999 | Baxter et al. ........................ 438/118 |
| 5,989,936 | * | 11/1999 | Smith et al. ......................... 438/118 |
| 5,994,168 | * | 11/1999 | Egawa .................................. 438/118 |
| 6,016,598 | * | 1/2000 | Middelman et al. ................. 29/830 |
| 6,020,220 | * | 2/2000 | Gilleo et al. ......................... 438/119 |
| 6,022,761 | * | 2/2000 | Grupen-Shemansky et al. ... 438/118 |
| 6,060,150 | * | 5/2000 | Nakatani et al. .................... 174/258 |
| 6,084,781 | * | 7/2000 | Klein .................................... 361/771 |
| 6,107,679 | * | 8/2000 | Noguchi ............................... 257/678 |
| 6,107,689 | * | 8/2000 | Kozono ................................ 257/778 |
| 6,111,323 | * | 8/2000 | Carter et al. ......................... 257/787 |
| 6,127,025 | * | 10/2000 | Bhatt et al. .......................... 174/255 |
| 6,136,733 | * | 10/2000 | Blumberg et al. .................... 29/832 |
| 6,141,210 | * | 10/2000 | Iwasaki ................................ 361/737 |

OTHER PUBLICATIONS

Peter Stampka, "Second Generation Contactless Cards," *IEEE Second Workshop on Smart Card Technologies and Applications, Berlin Nov. 16–18, 1998*; 8 pages.

E. Zakel, "Advanced Packaging for Smart Cards", *IEEE Second Workshop on Smart Card Technologies and Applications, Berlin Nov. 16–18, 1998*, 4 pages.

Dymax Europe GmbH, "UV Curing Resins for Smart Cards Innovations for Smart Cards", *IEEE Second Workshop on Smart Card Technologies and Applications, Berlin Nov. 16–18, 1998*, 4 pages.

K. Haberger et al. "Comparison of Different Methods to Make Extremely Thin IC's", *IEEE Second Workshop on Smart Card Technologies and Applications, Berlin Nov. 16–18, 1998*, 6 pages.

Reinhard Jurisch, "Coil on Chip Technology for Closed Coupling Contactless Chip Cards", Microsensys, *IEEE Second Workshop on Smart Card Technologies and Applications'98*, 5 pages.

Kevin Chung, Ph.D., "Smart Card Die–Attach and Module Lamination Alternatives", *IEEE Second Workshop on Smart Card Technologies and Applications, Berlin Nov. 16–18, 1998*, 9 pages.

"Dupont Photopolymer & Electronic Materials", *IEEE Second Workshop on Smart Card Technologies and Applications, Berlin Nov. 16–18, 1998*, 17 pages.

Günter Schiebel, "Low Cost Smart Card/RFID Assembly Using Flip Chip Shooter", Siemens AG, *IEEE Second Workshop on Smart Card Technologies and Applications, Berlin Nov. 16–18*, 12 pages.

* cited by examiner

CONTACT MODULE, AS FOR A SMART CARD, AND METHOD FOR MAKING SAME

This Application claims the benefit of U.S. Provisional Application Ser. No. 60/129,497 filed Apr. 15, 1999, of U.S. Provisional Application Ser. No. 60/131,377 filed Apr. 28, 1999, of U.S. Provisional Application Ser. No. 60/134,656 filed May 18, 1999. and of U.S. Provisional Application Ser. No. 60/141,344 filed Jun. 28, 1999.

The present invention relates to a module and, in particular, to a module including an electronic device, and to a method for making same.

As credit cards, phone cards, identification tags and badges, and other forms of identification devices and other commercial objects have become more sophisticated to offer greater capabilities and access to more services, the need for such objects to include more than just a stripe of magnetic material into which information is encoded has been recognized. Not only is the need recognized to store more information than can be encoded in a magnetic stripe, but also the need to include in the object electronic circuitry to receive, process and output information.

Conventionally, electronic circuitry in the form of semiconductor integrated circuits has been embedded into cards, tags and badges to receive, process and output information. Typically, the circuitry includes a microprocessor or a memory, or both. Information is provided to the card and is received from the card in the form of electronic signals by a card reader which typically includes electronic circuitry to verify or identify the information provided by the card in relation to the information provided to the card. For example, where the card is utilized as an access badge, the card reader signals the badge to provide identification information, and if the information provided matches information stored in the card reader to identify an authorized badge, then the card reader authorizes access, such as by releasing an electrical lock. In a more complex application, a card may be utilized as a substitute for money. The card reader, such as a point-of-sale terminal, cash register or automated teller machine, first verifies the identity of the money card as authorized to conduct a transaction and then queries the card as to the value of money it represents. If the card reader determines that the value of money represented by the card is sufficient to complete the transaction, then the card reader may subtract the value of the transaction and transmit to the money card the remaining value which is stored in memory in the card. The card reader may also, if the money card is a credit card, communicate with the bank or other institution that issued the card to make appropriate account entries.

Irrespective of the details of how a particular card, tag or badge functions, information in the form of electrical signals must be transmitted between the card, tag or badge and the card reader. Conventionally, this is accomplished by electrical contacts in predetermined locations on the card coming into electrical contact with corresponding contacts in the card reader to complete an electrical circuit. Conventional cards, such as card 10 of FIG. 1, are made of a plastic material and have a cavity 32 therein into which a module 20 including the contacts 26 and the electronic circuitry 24 is inserted. The module 20 includes a conventional printed wiring circuit board 22 having the contacts 26 on one surface thereof and connections 28 to the electronic circuitry 24 on the opposite surface thereof. The contacts 26 are typically formed by etching the copper conductive sheets on the opposing surfaces of an insulating substrate 22, such as an FR4 or other circuit board material, and forming connections between the opposing surfaces by drilling holes through the circuit board substrate and then filling the holes with conductive material, such as by plating the holes with copper. The individual circuit boards must be separated and cut to size, such as by routing, before electronic circuitry 24 is attached thereto. Electronic circuitry 24 is attached to circuit board 22 and connections 26 thereto are made by wire bonding (as illustrated) or by flip-chip interconnections. Finally, a glob of encapsulant 18 is applied to cover electronic circuitry 24 and may be ground flat to obtain a controlled height dimension with respect to circuit board 22. Thus, conventional module 20 requires many separate operations, such as masking, etching, drilling, plating, routing, soldering, attaching, wire bonding, encapsulating and grinding, each of which adds undesirable processing time and cost to the manufacture of module 20. Further, much of the processing must be performed on each individual circuit board 22 separately, adding further handling and cost.

Conventionally, module 20 resides in a cavity 32 of a card blank 30. Circuit board 22 of conventional module 20 is larger than is the electronic circuitry 24 thereon and the cavity 32 in the card blank 30 has an opening of like size and shape to that of circuit board 22. The main portion 34 of cavity 32 is smaller than the circuit board 22 and larger than the electronic circuitry 24 so as to form a shoulder 36 upon which circuit board 22 rests to properly position module 20 with respect to card 10. Module 20 is attached to card blank 30 by adhesive dispensed into cavity 32, the amount of which must be precisely controlled to bond to encapsulant 18 or to electronic circuitry 24 and circuit board 22, or by adhesive dispensed onto shoulder 26 to bond circuit board 22 thereto.

Conventionally, card blank 30 is formed of at least three layers of plastic material laminated together. The first layer 40 has a hole that defines the opening into which circuit board 22 is positioned and is of like thickness to circuit board 22. The second layer 42 has a hole that defines the volume in which electronic circuitry 24 resides, and is at least as thick as the maximum height of electronic circuitry 24 and encapsulant 18. The third layer 44 forms the bottom of cavity 32 and is of sufficient thickness to protect electronic circuitry 24. Each of the many operations, the three-layer lamination, adhesive dispensing and module placement, all undesirably add to the complexity and cost of card 10.

Unfortunately, even when conventional card 10 is manufactured using automated equipment, the many different operations required each add to the cost of card 10 and so it is relatively expensive to manufacture.

Accordingly, there is a need for a module that is much simpler and less costly to manufacture, and it would also be advantageous if the simplified module also allowed simplification of the card blank and assembly.

To this end, the present invention comprises a pattern of metal contacts having a first and a second surface, a layer of dielectric adhesive on the first surface of the pattern of metal contacts and having at least two holes therethrough to the first surface of the metal contacts, at least two electrically-conductive vias substantially filling the holes in the dielectric adhesive layer and contacting the first surface of the metal contacts, each conductive via having an end distal from the first surface of the metal contacts, and at least one electronic device having electrical contacts connected to the distal end of the conductive vias.

According to another aspect of the present invention, a method of making a module including an electronic device comprises:

providing a sheet of electrical contact material having first and second surfaces;

providing an electronic device having a pattern of contacts thereon;

forming a pattern of electrically-conductive vias on the first surface of the sheet of electrical contact material, the pattern of electrically-conductive vias corresponding to the pattern of contacts of the electronic device;

applying a layer of dielectric adhesive on the first surface of the sheet of electrical material except in locations corresponding to the electrically-conductive vias;

patterning the sheet of electrical material to define a pattern of electrical contacts thereon, wherein ones of the electrical contacts are associated with at least corresponding ones of the electrically-conductive vias; and attaching the electronic device with the contacts of the electronic device electrically connected to corresponding electrically-conductive vias.

BRIEF DESCRIPTION OF THE DRAWING

The detailed description of the preferred embodiments of the present invention will be more easily and better understood when read in conjunction with the FIGURES of the Drawing which include.

DESCRIPTION OF THE PREFERRED EMBODIMENT

In a contact module 100 according to the present invention, module 100 is arranged such that insofar as is practical the steps of the processing generally add structure to what has been thus far made and to reduce the number of steps in which material is removed. Moreover, the arrangement of contact module 100 lends itself to the convenient fabrication of a plurality of modules contemporaneously on a single panel, wherein the panel need not be separated into individual modules until at or near the final operation of the fabrication, thereby to reduce the handling and processing of modules individually and to eliminate the cost thereof.

Figure 1:
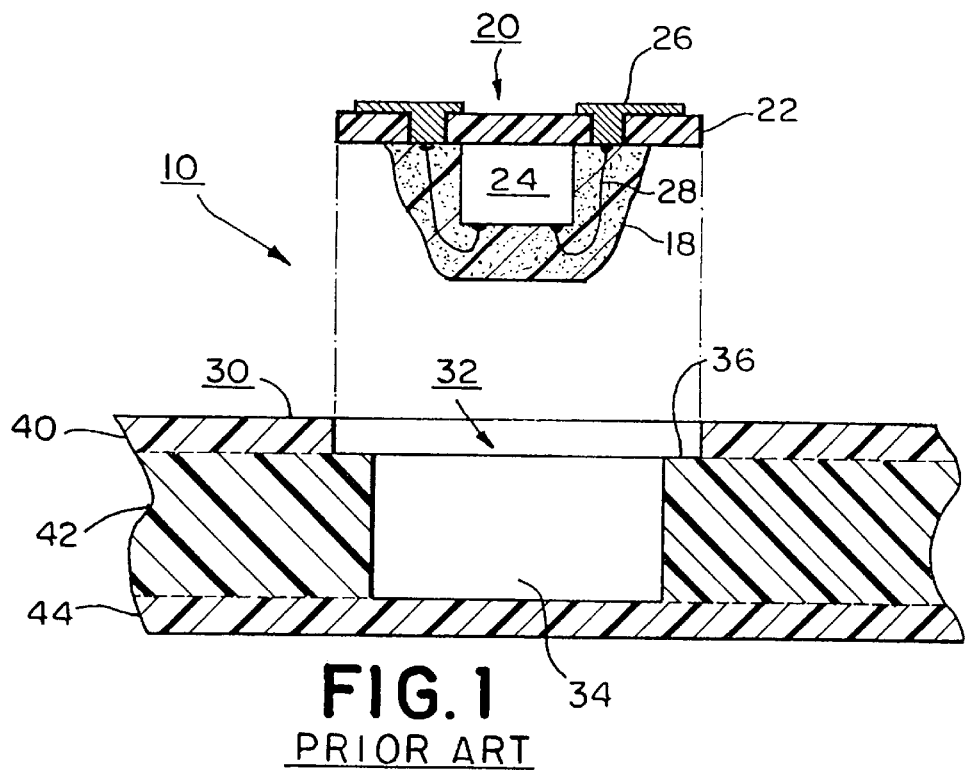
FIG. 1 is an exploded partial cross-sectional side view of a conventional contact module card.
Figure 2:
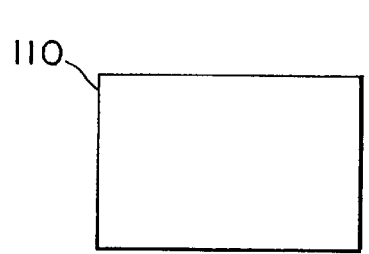
FIGS. 2–3 are plan views of a metal layer employed in the module of FIG. 6 in accordance with the present invention.

FIG. 2 is a plan view of a metal layer 110 employed in the module 100 in accordance with the present invention. Metal layer 110 is a thin sheet or foil of electrically conductive metal, such as a metal foil conventionally utilized to form lead frames for semiconductor integrated circuits or utilized in laminating printed wiring circuit boards. Suitable materials include copper, alloy 42, aluminum, nickel, kovar, and combinations and alloys thereof, beryllium copper, brass and other copper-based alloys, iron-based alloys, and other suitable metals, and laminates thereof. Metal layer 110 is later formed, for example, by photo-etching, to provide the external electrical contacts 114 of module 100, as described below, for transmitting and receiving electrical signals to and/or from a conventional card reader.

Figure 3:
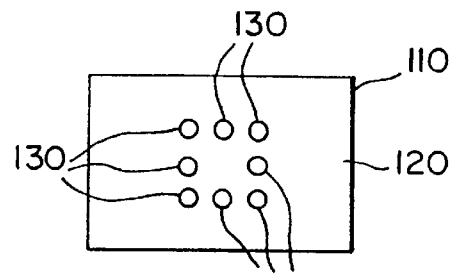
Figure 4:
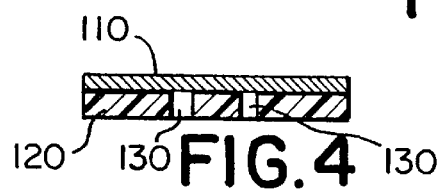
FIGS. 4–6 are side cross-sectional views further illustrating the fabrication of the module of FIG. 6 in accordance with the present invention.

FIG. 3 is a plan view and FIG. 4 is a side cross-sectional view of the metal layer 110 on which is applied a layer 120 of a dielectric material having suitable electrical insulating (i.e. dielectric) properties and suitable mechanical strength, rigidity and stability. Dielectric layer 120 is preferably a thermoplastic or thermosetting adhesive that is either deposited on metal layer 110 as a liquid or paste and is then dried or B-staged, i.e. is heated for a period of time to evaporate solvent or to form partial polymeric cross-links, or both, or is a sheet of B-staged thermoplastic or thermosetting adhesive that is laminated to metal layer 110. Preferably, dielectric layer 120 is applied by screen printing, stenciling, roll coating, mask printing, ink-jet printing, laminating or other suitable method. A pattern of via holes 130 in dielectric layer 120 expose a pattern of sites of metal layer 110 corresponding to contacts to be formed therein. Preferably, the pattern of via holes 130 correspond to the pattern of contacts 142 of an electronic device 140 that electrically connect to the external contacts of module 100 formed of metal layer 110, as described below. The via holes 130 may be formed by the screen, stencil, mask or other printing device, or may be present in the sheet of B-staged adhesive as laminated to metal layer 110, or, alternatively, may be subsequently formed, as by laser drilling, plasma etching, photo-etching, or other suitable method. While an exemplary pattern of via holes 130 and via conductors 132 are illustrated, it is understood that other patterns, and greater or lesser numbers of via holes 130 and via conductors 132, may also be employed.

Figure 5:
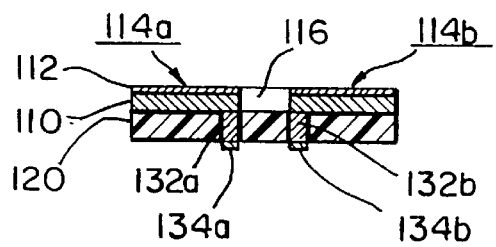

FIG. 5 is a side cross-sectional view further illustrating the fabrication of the module 100. Therein, metal is shown plated or otherwise deposited onto metal layer 110 through via holes 130 to form via contacts (or via conductors) 132, e.g., 132a, 132b, that substantially fill via holes 130, and preferably extend slightly beyond the surface of dielectric layer 120. Via conductors 132a, 132b are preferably formed of the same metal as is metal layer 110. It is noted that the depositing dielectric layer 120 and forming via conductors 132a, 132b can be performed in orders other than that just described. For example, holes in a patterned photoresist deposited on metal layer 110 may be utilized to define the size and locations of via conductors 132a, 132b into which metal is then plated or otherwise deposited onto metal layer 110 to form via conductors 132a, 132b. After via conductors 132a, 132b are formed, the photoresist is removed and the dielectric layer 120 is applied, in like manner to that described above. In any case, dielectric layer 130 provides mechanical strength for and supports metal layer 110 and via conductors 132a, 132b.

Metal layer 110 is patterned to form a pattern of electrical contacts 114, e.g., 114a, 114b that are electrically isolated from each other by gaps 116 and that are electrically connected to at least one of via conductors 132a, 132b, 134. Patterning of metal layer 110 is preferably by conventional photo- or chemical etching as is employed in the manufacture of printed wiring circuit boards, for example, or by other suitable methods. Where metal layer 110 is of a metal that may oxidize or otherwise not maintain good electrical conductivity, such as copper or aluminum, a layer of an oxidation resistant metal, such as nickel, tin, silver, gold, platinum, palladium, nickel-palladium, nickel-gold or other precious metal, or a combination or alloy thereof, is applied as layer 112 on contacts 114*a*, 114*b* and as layers 134*a*, 134*b* on via contacts 132*a*, 132*b*, respectively.

Figure 6:
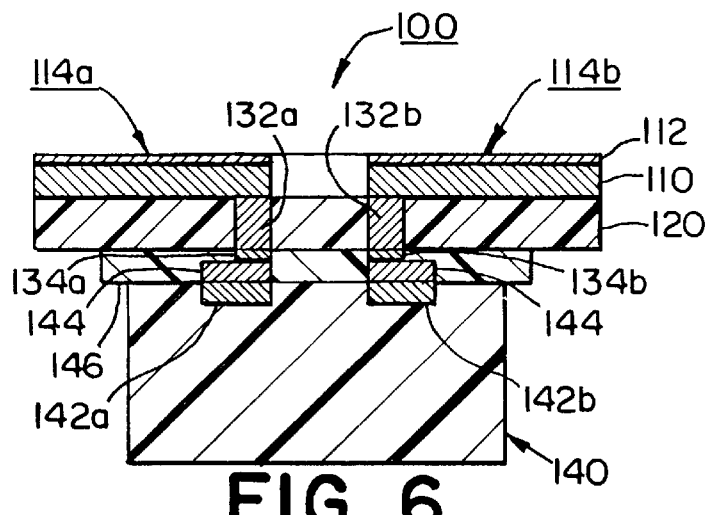

FIG. 6 is a side cross-sectional view further illustrating the fabrication of the module 100 in accordance with the present invention. An electronic device 140, such as a semiconductor die, an integrated circuit or a network of resistive, inductive and/or capacitive elements, or the like, is attached to metal layer 110 and dielectric layer 120. Preferably, electronic device 140 is attached in a flip-chip manner, i.e. a number of contact pads 140, e.g., 142*a*, 142*b*, thereon are electrically connected to corresponding ones of via conductors 132*a*, 132*b*. Also preferably, the locations of the contact pads 142*a*, 142*b* of electronic device 140 and of via conductors 132*a*, 132*b* correspond so that electrical connections therebetween may be made by bumps 144 of a suitable electrically-conductive material, for example, solder, electrically-conductive adhesive or other electrically-conductive polymer, which also mechanically attach electronic device 140 thereto. Preferably, the electrically-conductive adhesive is a flexible adhesive, i.e. an adhesive having a modulus of elasticity that is less than about 35,000 kg/cm$^2$ (about 500,000 psi) or having the ability to withstand at least 30% elongation before failure, as may be the dielectric adhesive. Where greater mechanical strength or support is desired, a dielectric underfill 146, preferably of an electrically-insulating adhesive, may be employed. Bumps 144 of electrically-conductive adhesive or solder may be deposited onto via conductors 132*a*, 132*b* or may be deposited onto the contact pads 142*a*, 142*b* of electronic device 140, for example, by screen printing, mask printing, stencil printing, ink jet printing or other suitable manner. Bumps 144 and underfill 146 may be applied as a preformed membrane of the insulating underfill 146 material having the desired pattern of conductive material 144 formed therein, for example, as described in U.S. patent application Ser. No. 09/226,543 entitled "Flexible Adhesive Membrane and Electronic Device Employing Same" filed Jan. 7, 1999, which is hereby incorporated herein by reference in its entirety. Also preferably, contacts 142 of electronic device 140, which are often of aluminum, are coated with a layer of an oxidation resistant metal, such as nickel, tin, silver, gold, platinum, palladium, nickel-palladium, nickel-gold or other precious metal, or a combination or alloy thereof.

Figure 7:
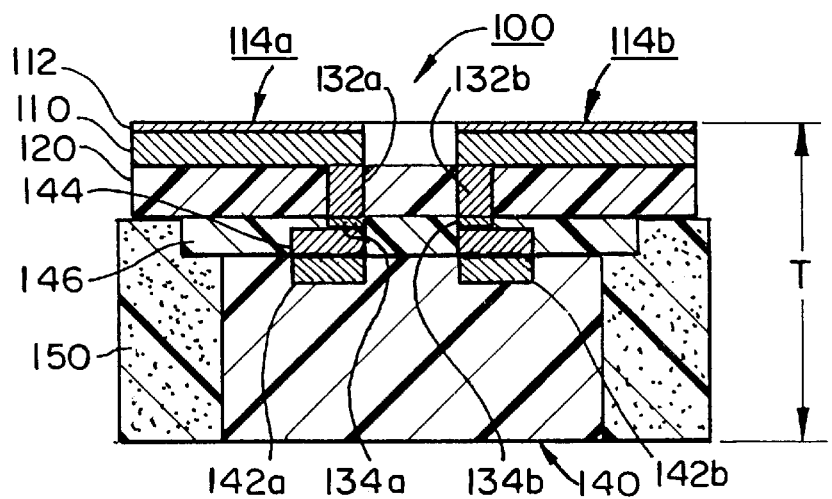
FIGS. 7 and 8 are side cross-sectional views of further arrangements of the module of FIG. 6 in accordance with the present invention.

FIG. 7 is a side cross-sectional view of an arrangement of module 100 of FIG. 6 including an encapsulating material 150. Encapsulating material 150 surrounds electronic device 140 to seal at least the region in which electrical contacts 132*a*, 132*b*, 142*a*, 142*b* and connections 144 reside, thereby to provide resistance to the intrusion of moisture, chemicals and other contaminants. Preferably, encapsulating material 150 preferably covers electronic device 140 and is a high-flow adhesive that can also provide the means for attaching module 100' to a next level article with which it is to be assembled for use, such as a "smart card", credit card, money card identification tag or badge, or the like. Any adhesive with leveling ability to form a flat surface is generally suitable. One suitable encapsulating adhesive is a type MB7060 thermoplastic adhesive available from AI Technology located in Princeton, N.J., which has the beneficial property of a low melt-flow temperature of about 70° C. which is compatible with the polyvinyl chloride, polyester and other plastic materials of which such next-level articles are typically made. Encapsulating adhesive 150 is preferably applied to a panel of a plurality of modules 100 before they are singulated or separated into individual modules.

Figure 8:
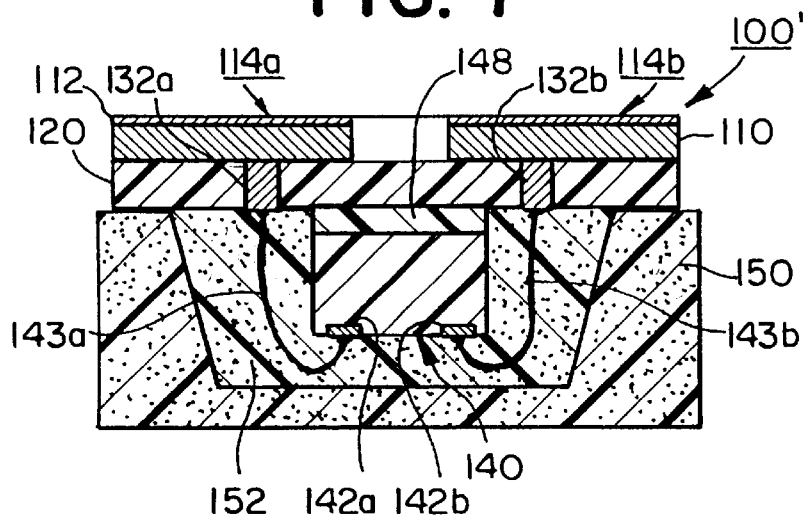

FIG. 8 is a side cross-sectional view of an alternative embodiment 100' of module 100 of FIG. 6 in which electrical connections to electronic device 140 are made by conventional wire bonds 143*a*, 143*b* rather than by conductive adhesive bumps 144. Electronic device 140 is attached to metal layer 110 and dielectric layer 120 by a conventional die-attach adhesive 148, typically an electrically-conductive adhesive, with its contact pads 142*a*, 142*b* exposed. Electrical connections between contact pads 142*a*, 142*b* of electronic device 140 and conductive vias 132*a*, 132*b*, respectively, are made by conventional wire bonds 143*a*, 143*b* formed by wire bonding fine wires of gold or aluminum. Electronic device 140 and wire bonds 143*a*, 143*b* may be encapsulated by conventional glob-top or other molded encapsulating dielectric material 152. Optionally, or alternatively, module 100' may be encapsulated by a high melt flow encapsulating material 150 of like type to that described in relation to FIG. 7, whether or not the conventional encapsulation 152 is employed. The total thickness T of module 100 is the combination of the thicknesses of the metal layer 110, dielectric layer 120, electronic device 140 and encapsulating adhesive 150, and is typically about 375–625 $\mu$m (about 15–25 mils).

FIGS. 9, 9A, 10, 10A and 11 are plan views illustrating the fabrication of a plurality of modules 100 as in FIG. 6 or FIG. 7 as a panel of modules 100, and the method therefor. In a typical module 100, 100' intended for use in a next level article such as a "smart card", credit card, money card identification tag or badge, or the like, the materials employed need only withstand the temperature range to which such commercial article is expected to be exposed, for example, –40° C. to +85° C. Thus, the effects of differences in the coefficients of thermal expansion of the various materials utilized in such commercial articles is of less concern due to the limited temperature range than is the case for articles to be exposed to more extreme temperatures, such as the –55° C. to +150° C. range specified for certain aerospace and military articles.

Figure 9:
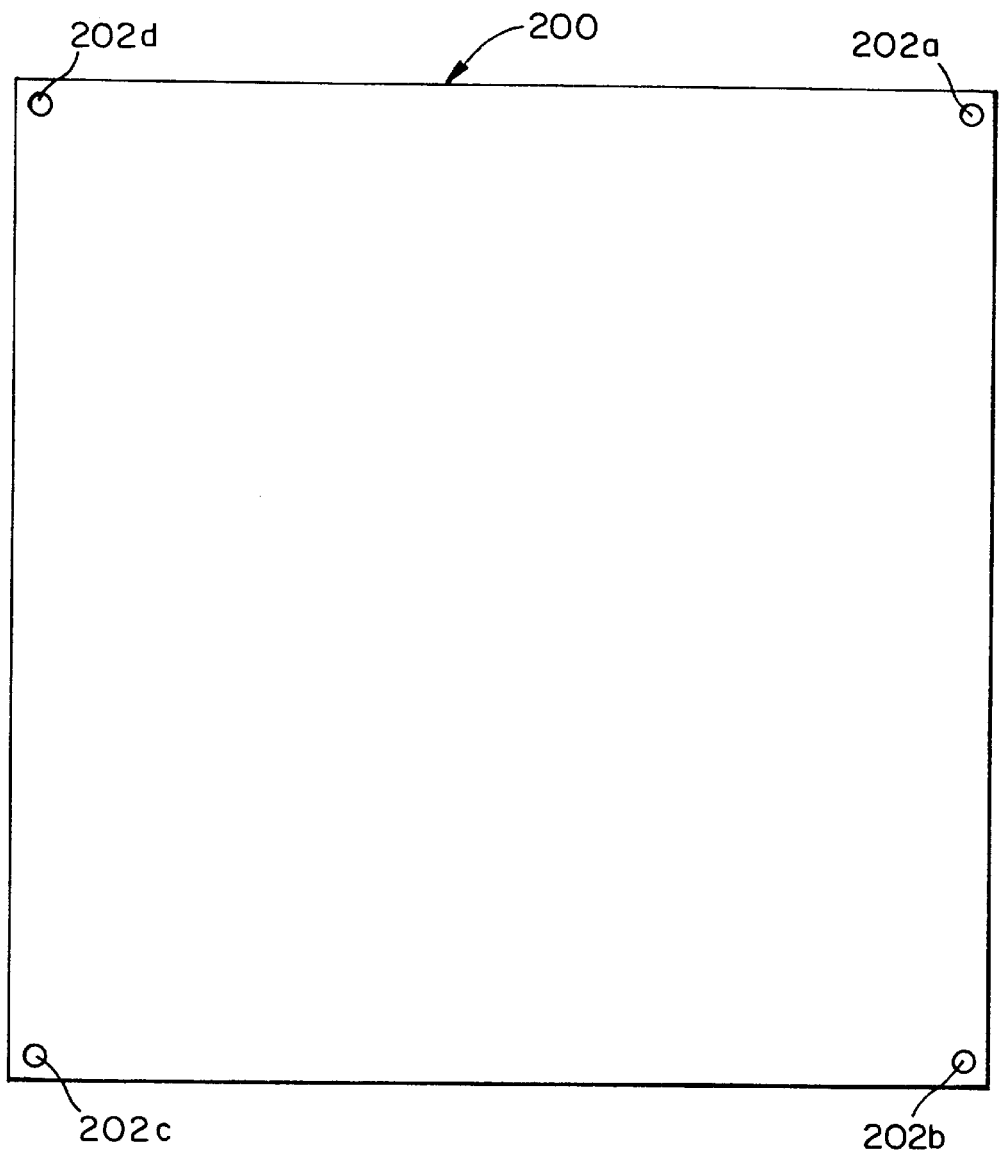
FIGS. 9, 10 and 11 are plan views illustrating the fabrication of a plurality of modules as in FIG. 6 or FIG. 7 as a panel of modules.

As shown if FIG. 9, a sheet 200 of copper foil of about 25–75 $\mu$m (about 1–3 mils) thickness, and of the same type as that used for conventional printed circuit board wiring fabricated on conventional FR4 material, is typically provided as metal layer 110 for a plurality of modules 100, 100' to be formed in an array on a panel 200 of material. Typically, a panel 200 that is about 25 cm by 25 cm (about 10 inches by 10 inches) may be employed to contemporaneously fabricate an 18 by 20 array of 360 modules. Other sizes of panels may also be employed, such as an about 25 cm by 50 cm (about 10 inch by 20 inch) panel, or an about 50 cm by 50 cm (about 20 inch by 20 inch) panel, as may be convenient. Panel 200 has a set of at least two, and preferably more than two, alignment holes 202, for example, a set of alignment holes 202*a*, 202*b*, 202*c*, 202*d*, for registering the various layers of material and or masks, screens, stencils and the like utilized in the fabrication of modules 100, 100'.

Figure 10:
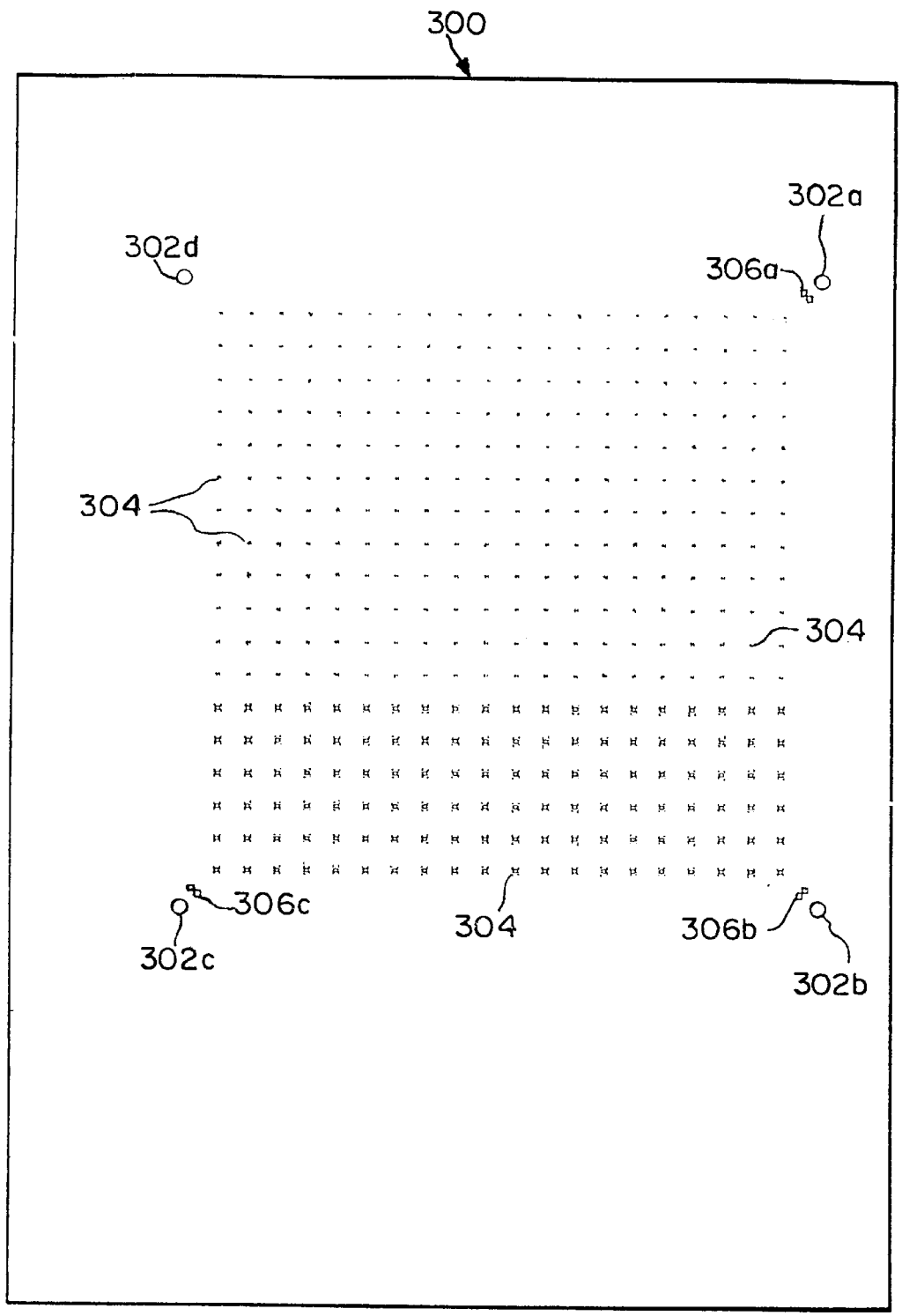
Figure 10A:
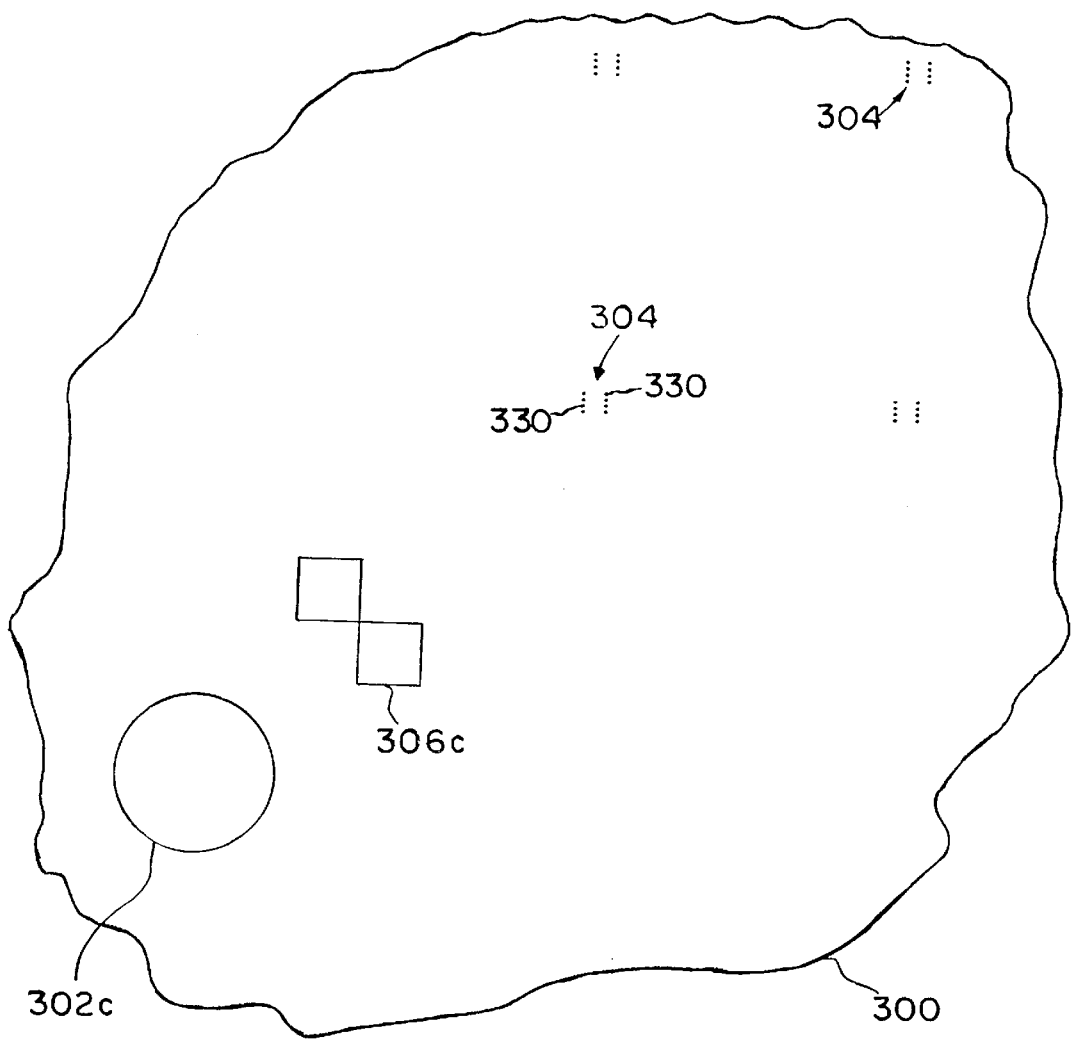
FIGS. 10A and 11A are enlarged views of respective portions of FIGS. 10 and 11.

Dielectric layer 120 is preferably stenciled or screen printed onto the metal panel 200, for example, utilizing the stencil or mask panel 300 shown in FIG. 10 which includes an 18 by 20 array of repeating patterns 304 of openings 330 corresponding to via holes 130. Dielectric layer 120 can also be applied by other conventional methods, such as film lamination, liquid spinning, paste screening and paste draw down methods. Stencil 300 includes a set of relational alignment holes 302, i.e. 302*a*, 302*b*, 302*c*, 302*d*, in the exact same pattern as are alignment holes 202 of metal panel 200 and a set of fiducial marks 306, i.e. 306*a*, 306*b*, 306*c*, for further facilitating alignment of stencil 300. An expanded view of a portion of FIG. 10 is shown in FIG. 10A in which ones of the pattern 304 of openings 330 are visible. The relative positions of the set of alignment holes 302, the patterns 304 of openings 330 and the fiducial marks 306 are in a predetermined positional relationship.

Dielectric layer 120 is preferably of a material that is relatively high in viscosity and thixotropic index, and should preferably contain at least 50% solids so that layer 120 may be deposited with suitable thickness. For example, dielectric layer 120 typically has a wet thickness of about 150 μm (about 6 mils) corresponding to a dry thickness after B-staging of about 100 μm (about 4 mils). Both thermoplastic and thermosetting adhesives may be employed for dielectric layer 120, and should preferably have good rigidity and toughness, for example, as exhibited by adhesives having a modulus of elasticity over about 35,000 kg/cm$^2$ (about 500,000 psi) and an elongation in the range of 3–30% when cured. Suitable adhesives will not be adversely affected by exposure to the etching and plating chemicals and other chemicals, and to the process environments, utilized in processing operations subsequent to application of the adhesives, whether the adhesive is in its dried or B-staged state or in its cured state at the time of such exposure. Suitable adhesives for dielectric layer 130 includes types LESP7670-SC or LESP7450-SC fast-curing thermosetting epoxy adhesive in liquid form, available from AI Technology located in Princeton, N.J., also available as types ESP7670-SC and ESP7450-SC fast-curing thermosetting epoxy adhesives in paste form, and types LESP7675 and ESP7675 thermosetting epoxy adhesives.

Screened dielectric layer 120 is dried (or B-staged) at an elevated temperature of about 60–80° C. to remove the solvent from the deposited adhesive, and is then cured at an elevated temperature in the range of about 80–150° C. Curing is typically performed at a temperature of about 100° C. for about 60 minutes, but may be performed at a relatively low temperature of about 80° C. for several hours, or at a relatively higher temperature of about 150° C. for a few minutes.

Via holes 130 in dielectric layer 120 typically are of about 50–500 μm (about 2–20 mils) diameter, and more usually of about 125–250 μm (about 5–10 mils) diameter, and are formed in the screen printing of dielectric layer 120 or, where layer 120 is laminated to copper layer 110, are formed by die cutting, laser drilling photo-etching or other suitable method, either before or after the lamination of metal layer 110 and dielectric layer 120. A stencil or mask 300 as shown in FIGS. 10 and 10A may be utilized in forming dielectric layer 120 either by directly printing dielectric adhesive onto metal layer 110 or by printing dielectric adhesive onto a sheet of release liner, B-staging the adhesive to dryness, and then transferring the sheet of dielectric material 120 and laminating it to metal layer 110 in registration predetermined by the positional relationship of the alignment holes 202 and 302 of metal sheet 200 and of dielectric layer 120, respectively.

Figure 11:
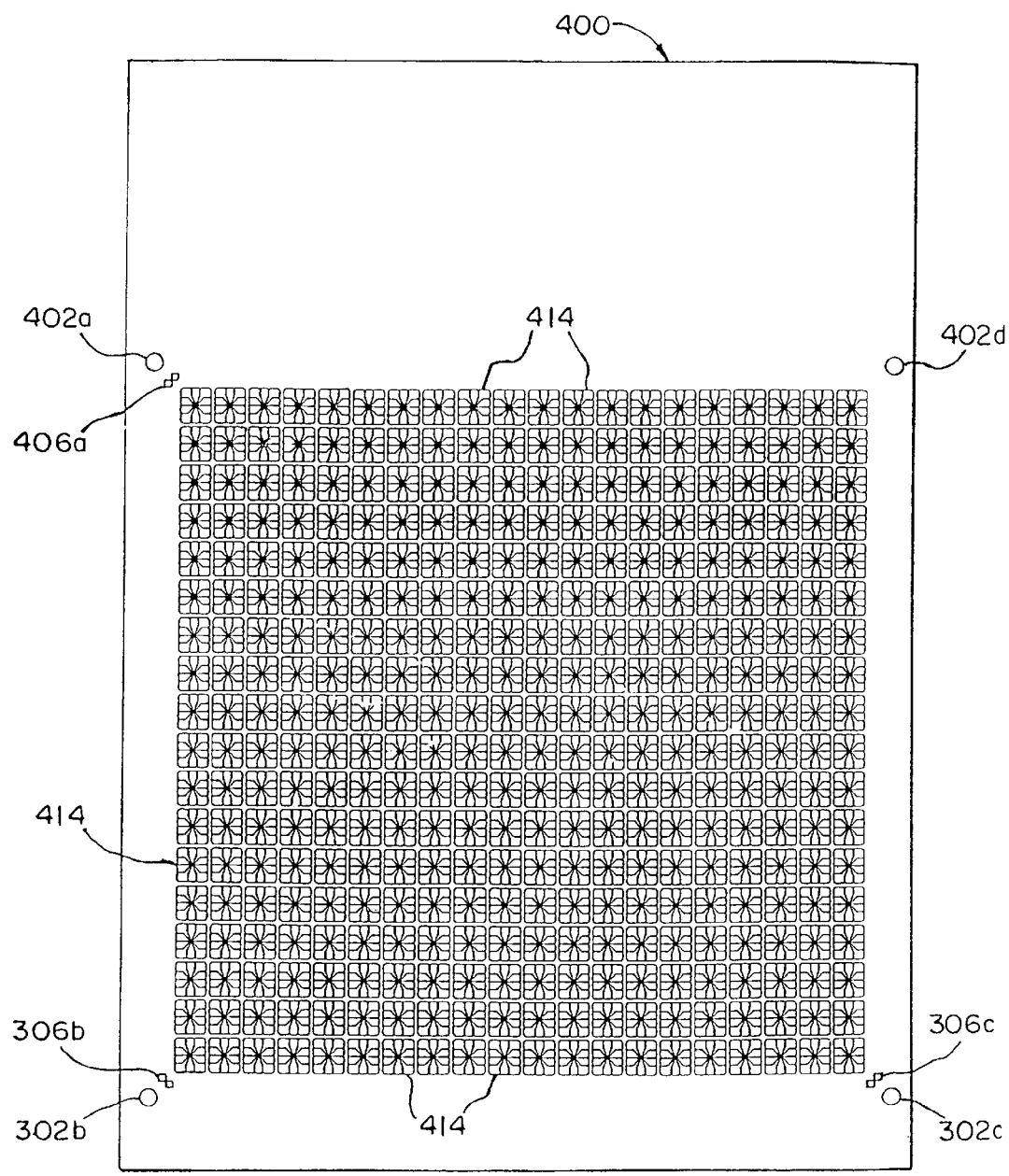
Figure 11A:
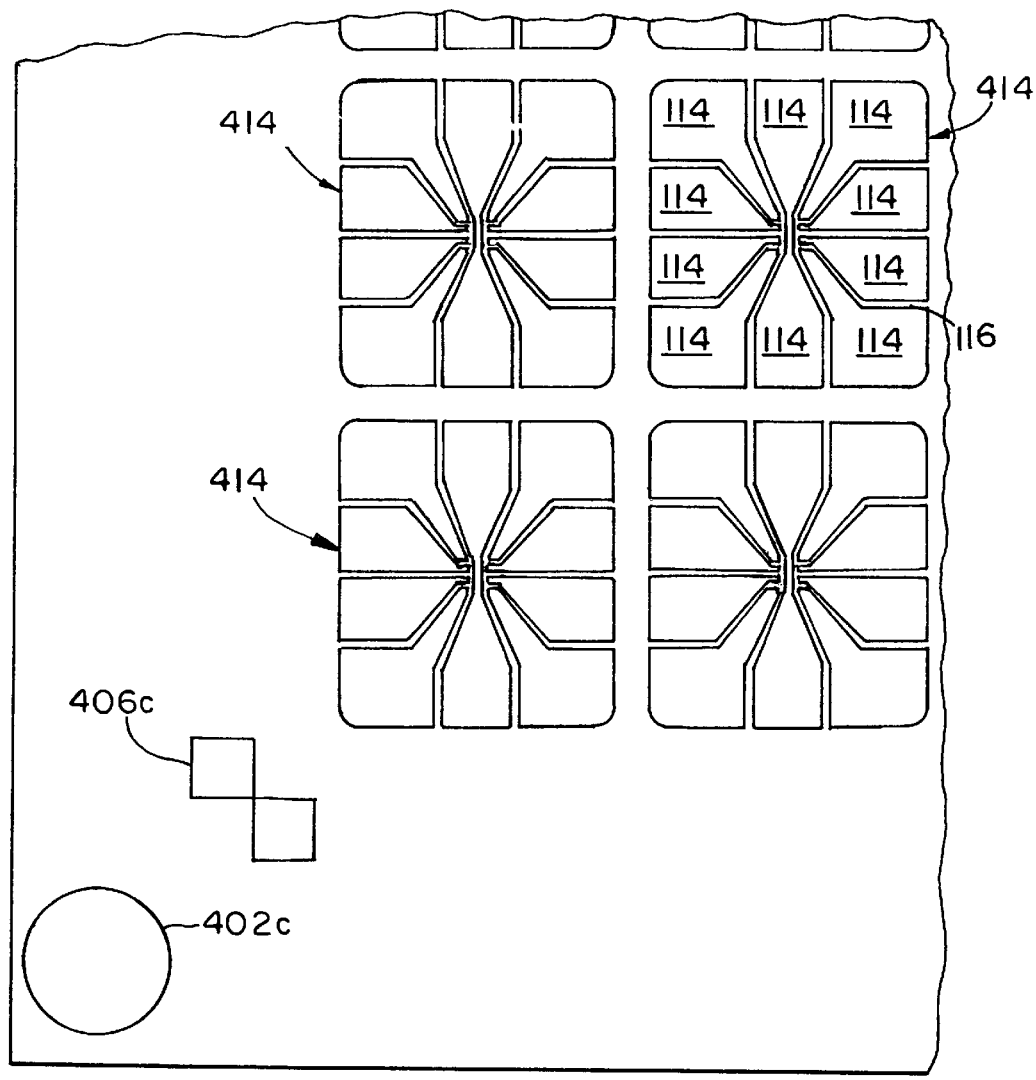

Copper is plated onto the exposed sites on copper layer 110 that are at the bottoms of via holes 130 to build up via conductors 132, and copper layer 110 is patterned to create gaps that define the external contacts 114 of module 100, 100'. FIG. 11 shows a mask pattern 400 for an 18 by 20 array of repeating patterns 414 of contacts 114, each of which is in predetermined positional relationship with alignment holes 402, i.e. 402*a*, 402*b*, 402*c*, 402*d*, and fiducial marks 406, i.e. 406*a*, 406*b*, 406*c*. The relative positions of the set of alignment holes 402, the patterns 414 of contacts 114 and the fiducial marks 406 are in the same predetermined positional relationship as are alignment holes 302, patterns 304 and fiducial marks 306 of stencil 300. In the expanded view of a portion of stencil 300 of FIG. 11A is shown a detail view of the pattern 414 of contacts 114. The generally rectangular pattern 414 of ten contacts 114 is about 11 mm by 12.5 mm (about 0.435 inch by 0.492 inch) with gaps 116 of about 0.25 mm (about 0.01 inch) between the contacts 114, which is the pattern of International Standard ISO-7816-2 entitled "Identification Cards—Integrated Circuit(s) Cards With Contacts" issued by the International Organization for Standardization, and available in the United States from the American National Standards Institute (ANSI) located in New York, N.Y.

The panel of modules 100 may now be excised or singulated into individual modules 100 of the sort shown in FIG. 6, or may be further processed by applying a suitable insulating adhesive 150 to overcoat and/or surround electronic device 140 to obtain a panel of modules 100 of the sort shown in FIG. 7. Any adhesive having suitable leveling characteristics to provide a relatively flat surface may be employed. One suitable adhesive is type MB7060 or MB7060-W thermoplastic electrically-insulating adhesive available from AI Technology, which has high flow at a melt temperature of about 65–75° C. and bonds well to common card materials such as PVC with good resistance and insensitivity to moisture. Encapsulating adhesive 150 may be applied by conventional methods such as roll coating screen printing, stenciling and the like, or may be applied by laminating a sheet of dried or B-staged adhesive to the panel of modules 100. Typically, the thickness of the adhesive layer 150 is about the same as the height of electronic device 140, typically about 250–500 μm (about 10–20 mils) to form a panel of modules 100 having a slightly greater thickness, typically about 350–600 μm (about 14–24 mils). However, a slightly greater yet thickness of adhesive 150, typically about 250–500 μm (about 10–20 mils) thicker than the height of electronic device 140, is desirable so as to cover electronic device 140 with encapsulating adhesive 150 where such adhesive is to be employed to also secure module 100 into the next level article. It is noted that this latter arrangement offers the advantage that a simple single-level cavity is suitable to receive and hold module 100, rather the more complex and more expensive multi-level cavity that is required for conventional modules. In addition, although modules 100, 100' fabricated as described have a substantially planar adhesive layer 150 surface that is substantially parallel to the plane in which contacts 114 lie, modules 100, 100 may be employed even where such planarity and parallelism is lacking because the high melt flow characteristic of adhesive layer 150 tends to level out imperfections and tolerances when modules 100, 100' are inserted into cavities of the next-level articles in which they are utilized.

The panel of modules 100 is singulated into separate individual modules 100 by any suitable and convenient method, such as die cutting or other cutting device, or by laser cutting, stamping and rotary die cutting. Where the adhesive employed in layer 120 is a high-strength adhesive, it is preferred that the high-strength adhesive be only dried or B-staged during the fabrication of the panel and that the panel be singulated into individual modules prior to curing the adhesive. This is desirable because the adhesive is much easier to cut before curing and is much more difficult to cut after curing which increases its strength many times, e.g., more than 100 times for a high-strength adhesive such as AI Technology type ESP7670-SC or LESP7670-SC. AI Technology types ESP7675 or LESP7675 may also be utilized.

In the example of FIGS. 9–11, an exemplary pattern of eight via holes 130 and via conductors 132 arranged in two rows of four via holes 130 each are shown, and an exemplary pattern 414 of ten contacts 114 are shown, only eight of which contacts 114 have via conductors 132 associated therewith, i.e. the eight via conductors 132 are associated with the two rows of four contacts 114 along the longer edges of pattern 414 and the two central contacts 414 along the shorter edges thereof are not connected in this example. It is understood that greater and lesser numbers of contacts and other patterns of contacts, and greater or lesser numbers of via holes 130 and via conductors 132 and other patterns thereof, may also be employed.

In addition, panels of modules 100 may be processed in continuous fashion by abutting the panels and providing sprocket drive holes therein and a sprocket drive mechanism or by forming modules 100 on a continuous web or strip of dielectric substrate 120 material or metal foil 200. In such case, dielectric adhesive is applied, electroplating and photo-etching is performed, conductive adhesive is deposited continuously as the panels, web or strip, as the case may be, passes respective stations performing such operations.

Any of the following three processes may be utilized to the end of making a circuit substrate of module 100, 100'. In a first of the processes, a first photoresist or other suitable masking resin is applied, selectively exposed as through a mask to form selective cross-links, and developed to define the pattern of contact pads 114 of the individual modules for subsequent metallization. A layer 112 of nickel, or other suitable passivating metal, is deposited onto contacts 114 and onto the via sites at the bottoms of via holes 130, typically to a thickness of a few microns (i.e. micrometers) such as by electrolytic or electroless plating. In addition, the plating of the nickel onto the via sites should be of sufficient thickness to fill via holes 130 with metal so as to be at or slightly above the surface of dielectric layer 120, thereby forming via conductors 132. This may be by plating nickel to the necessary thickness, or by plating copper onto the via sites, such as by electrolytic plating, to fill via holes 130 with metal to form via conductors 132 and then plating a layer 134 of nickel thereon. Preferably the nickel layers 112, 134 on contacts 114 and via conductors 132 are finished with a flash or electroplate of gold or palladium or other precious metal for reduced electrical resistance, unless satisfactory electrical contact can be obtained and maintained with the nickel layer 112, 134 alone. The first photoresist is then stripped away and a second photoresist is applied to metal layer 110 to cover the contacts 114, and is exposed and developed to define the areas of metal layer 110 to be etched away to provide gaps 116 between contacts 114. The exposed vias 132, 134 extending from dielectric layer 130 may also be masked. Metal layer 110 is then etched or stripped chemically to leave the pattern of contacts 114. Alternatively, the first photoresist may be left in place until after the photo-etching of metal layer 110, and then both the first and second photoresists maybe removed. Thus, a module 100, 100' circuit substrate of metal layer 110 and dielectric layer 120 having larger contacts 114 on one side thereof for making contact with a card reader and having smaller contacts 132, 134 on the other side thereof for making connection to an electronic device 140 is provided.

In a second of the processes, a photoresist is applied to metal layer 110 to cover the areas of metal layer 110 that will be contacts 114, and is exposed and developed to define the metal to be etched away to provide gaps 116 between contacts 114. The exposed via holes 130 in dielectric layer 130 may also be masked to prevent etching of the via sites at the bottom thereof on metal layer 110. After the photoresist is exposed and developed, metal layer 110 is then etched or stripped chemically to leave the pattern of contacts 114 and then the photoresist is stripped away. A layer 112 of nickel, or other suitable passivating metal, is deposited onto contacts 114 and onto the via sites at the bottoms of via holes 130, typically to a thickness of a few microns (i.e. micrometers) such as by electrolytic or electroless plating. In addition, the plating of the nickel onto the via sites should be of sufficient thickness to fill via holes 130 with metal so as to be at or slightly above the surface of dielectric layer 120, thereby forming via conductors 132. This may be by plating nickel to the necessary thickness, or by plating copper onto the via sites, such as by electrolytic plating, to fill via holes 130 with metal forming via conductors 132 and then plating a layer 134 of nickel thereon. Preferably the nickel layers 112, 134 on contacts 114 and via conductors 132 are finished with a flash of gold or palladium or other precious metal for reduced electrical resistance, unless satisfactory electrical contact can be obtained and maintained with the nickel layer 112, 134 alone. It is noted that where via conductors 132 are built up of deposited copper, the nickel finish 112, 134 on contacts 114 and on via contacts 132 may be deposited at the same time and after the copper is deposited. Thus, a module 100, 100' circuit substrate of metal layer 110 and dielectric layer 120 having larger contacts 114 on one side thereof for making contact with a card reader and having smaller contacts 132, 134 on the other side thereof for making connection to an electronic device 140 is provided.

In a third of the processes, a photoresist or other suitable masking resin is applied to exposed metal layer 110, but is not exposed or developed at this time. Copper is then plated onto the via sites at the bottom of via holes 130 of sufficient thickness to fill via holes 130 with copper so as to be at or slightly above the surface of dielectric layer 120, thereby forming via conductors 132. The photoresist is then exposed and developed to define the pattern of contact pads 114 of an individual module, i.e. to define the areas of metal layer 110 that will remain to provide contacts 114. A layer 112, 134 of nickel, or other suitable passivating metal, is deposited onto contacts 114 and onto via conductors 132, typically to a thickness of a few microns (i.e. micrometers) such as by electrolytic or electroless plating. Preferably the nickel layers 112, 134 on contacts 114 and via conductors 132 are finished with a flash or electroplate of gold or palladium or other precious metal for reduced electrical resistance, unless satisfactory electrical contact can be obtained and maintained with the nickel layer alone. The photoresist is then stripped away and a suitable solution is applied to preferentially etch metal layer 110 chemically to remove the uncovered copper areas, but leave the pattern of contacts 114 which are protected by the nickel or nickel/gold layers that are unaffected by the preferential etching solution. Alternatively, a second photoresist can be applied, exposed and developed to protect contacts 114 and via conductors 132, 134 against etching. Thus, a module 100, 100' circuit substrate of metal layer 110 and dielectric layer 120 having larger contacts 114 on one side thereof for making contact with a card reader and having smaller contacts 132, 134 on the other side thereof for making connection to an electronic device 140 is provided.

Alternatively, via conductors 132, 134 may be built up of an electrically-conductive adhesive deposited onto metal layer 110, preferably over a thin layer of nickel, gold or other suitable passivating metal deposited on the via sites on metal layer 110, for example, at the bottoms of via holes 130.

Connecting bumps 144 are preferably directly deposited as by screen or mask printing onto the contact pads 142 of electronic device 140 or onto the contacts 114 of the circuit substrate of module 100, 100'. The preferred material is a flexible electrically-conductive adhesive having a high thixotropic index which facilitates precise deposition. Suitable electrically-conductive adhesives include types PSS8090 and PSS8150 thermoplastic polymer adhesives and type ESS8450 thermosetting polymer adhesives in paste form, also available from AI Technology. Connecting adhesive bumps 144 are printed with a wet thickness of about 50–100 μm (about 2–4 mils), and electronic device 140 may be attached thereto while the adhesive is still wet. The adhesive is then dried at an elevated temperature of about 60–80° C. for about 30–60 minutes to form a satisfactory electrical and mechanical connection and bond between contacts 142 of electronic device 140 and via contacts 132, 134 of module 100, 100'. Alternatively, bumps 144 may be solder bumps. To further strengthen the attachment of electronic device 140, an underfill of a low viscosity, non-thixotropic, and therefore, high flow, adhesive may be employed. Suitable underfill adhesives include type MEE7650 flexible thermosetting insulating adhesive and type MEE7660 high-strength thermosetting adhesive available from AI Technology, which are cured at a temperature of about 80–150° C. similar to the type LESP7675 adhesive employed in dielectric layer 120 as described above.

It is noted that module 100, 100' is suitable for utilization in many different kinds and types of next-level articles, such as smart cards, identification tags, credit and money cards and the like made by conventional and new methods. Such suitable articles include, for example, those described in U.S. patent application Ser. No. 09/412,058 entitled ""Article Having An Embedded Electronic Device, And Method Of Making Same" and in U.S. patent application Ser. No. 09/411,849 entitled "Wireless Article Including A Plural-Turn Antenna" both of which being filed by Kevin K-T Chung on even date herewith, which applications are hereby incorporated herein by reference in their entireties.

Figure 12:
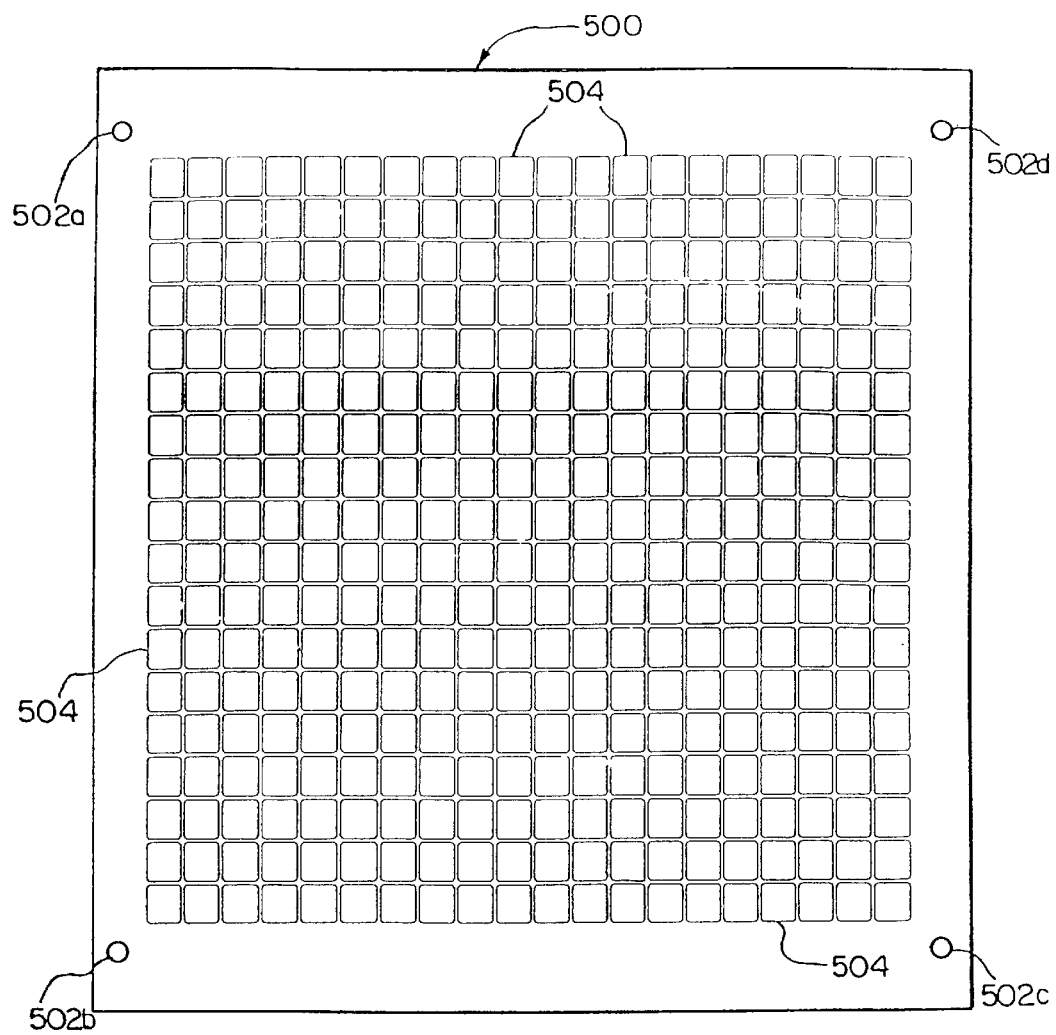
FIG. 12 is a plan view of an exemplary package in which the modules of FIGS. 6, 7 and 8 may be stored.

Completed modules 100, 100' may, for convenience, be stored in a waffle package 500 shown in FIG. 12 which has an 18 by 20 array of receptacles 504 each of a size to receive a module 100, 100'. For facilitating automated operations, such as pick-and-place equipment picking modules 100, 100' from receptacles 504 of waffle package 500 and placing them into proper position on cards, tags or other next-level articles, package 500 includes a set of relational alignment holes 502, preferably in like positional relationship to the alignment holes 202, 302 and 402 of metal panel 200, via stencil 300 and contact stencil 400, respectively.

Figure 13:
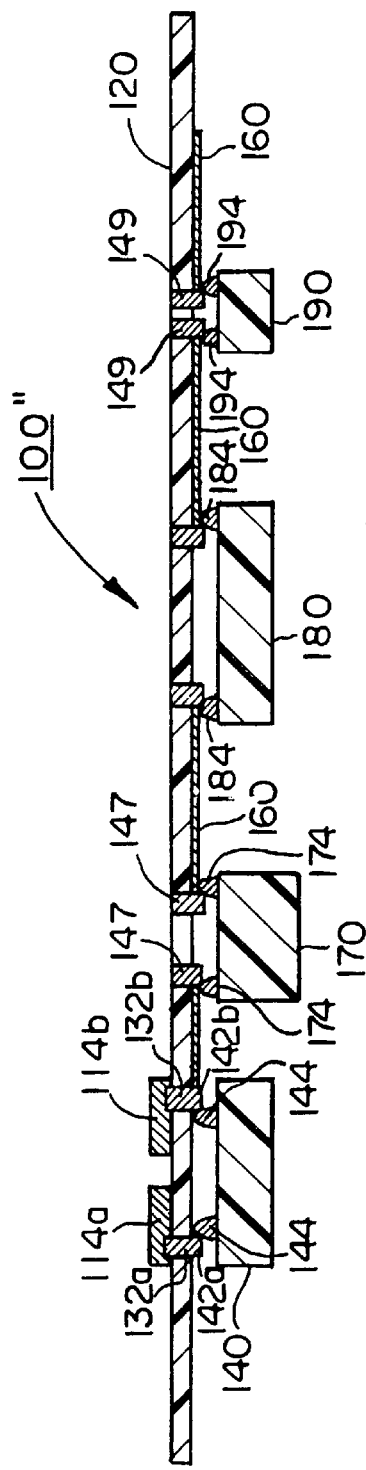
FIG. 13 is a side cross-sectional view of a further arrangement of the module of FIG. 6 in accordance with the present invention.

FIG. 13 is a side cross-sectional view of a module 100" including plural electronic devices 140, 170, 180, 190 connected by conductors 160, but otherwise similar to contact module 100 of FIG. 6 in construction and materials, in accordance with the present invention. Electronic devices 140, 170, 180, 190 may be integrated circuits, diodes, transistors, resistors, capacitors, inductors, or networks of such components, or any combination thereof. Contacts 114a, 114b, dielectric layer 120, conductive vias 142a, 142b and electronic device 140 are as described above. In like manner to conductive vias 142a, 142b, conductive vias 147, 147 and 149 are built up on the metal layer 110 by depositing electrically-conductive adhesive (e.g., types ESS8450 and PSS8150 available from AI Technology) or building up metal (e.g., copper, nickel or aluminum) thereon and are provided for connecting electronic devices 170, 180, 190, respectively, in circuit, and are fabricated substantially contemporaneously with conductive vias 142a, 142b. When metal layer 110 is removed as by photo-etching to leave the pattern of contacts 114a, 114b, the metal of layer 110 proximate conductive vias 147, 148, 149 is substantially removed leaving conductive vias 147, 148, 149 flush with the surface of dielectric layer 120 or projecting slightly therefrom. A layer of oxidation-resistant nickel-gold is deposited relatively heavily on the exposed portions of contacts 114a, 114b, and relatively lightly on the exposed portions of conductive vias 132a, 132b, 147. 148, 149.

Conductors 160 are preferably conductive adhesive (such as type PSS8150 or type ESS8450) deposited on dielectric layer 120 (such as type ESP7450 insulating adhesive) and contacting conductive vias 132a, 132b, 147, 148, 149 for connecting them in circuit. The respective contacts of electronic devices 140, 170, 180, 190 are attached to conductive vias 132a, 132b, 147, 148, 149 by bumps 144, 174, 184, 194 of conductive material such as solder and electrically-conductive adhesive, which may be applied either to the ends of vias 123a, 132b, 147, 148, 149 or to the contacts of electronic devices 140, 170, 180, 190. It is noted that either solder bumps or conductive adhesive bumps, or both, may be employed on a given module 100", and in fact it may be preferable to employ flexible conductive adhesive bumps for connecting an integrated circuit device and solder bumps for connecting resistors, capacitors, and the like. Conductive bumps 144, 174, 184, 194 may be about 70 μm (about 3 mils) diameter, or other suitable size. Suitable underfill may be utilized between devices 140, 170, 180, 190, if desired, to increase the strength of the bonding of devices 140, 170, 180, 190 to dielectric layer 120.

It is further noted that solder bumps can be employed with conductive vias and conductors formed of electrically-conductive adhesive that have been plated with a suitable metal, such as nickel, gold, nickel-gold and the like, as well as with metal conductive vias. Further, suitable insulating underfill may be utilized to strengthen the attachment of one or more of electronic devices 140, 170, 180, 190 as desired.

Figure 14:
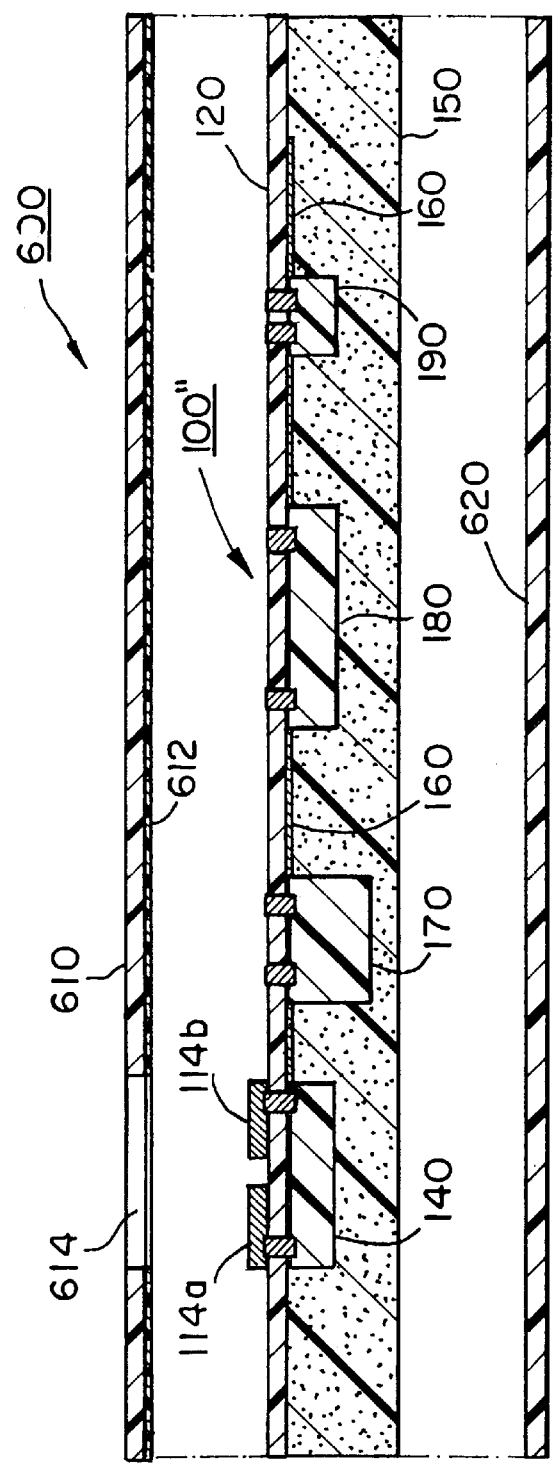
FIG. 14 is an exploded side cross-sectional view of the module of FIG. 13 in an article in accordance with the present invention.

FIG. 14 is an exploded side cross-sectional view of the contact module 100" of FIG. 13 included in an article 600. Module 100" is laminated between two card blanks 610, 620 where article 600 is to be utilized as a credit card, debit card, smart card or the like, and may be laminated only to card blank 610 where it is to be utilized as an identification tag or the like. In either case, card blank 610 includes a thin layer 612 of high melt-flowable adhesive (e.g., an about 25 μm thick (about 1 mil thick) layer of type MB7060 or type MB7100 adhesive) that serves to bond card blank 610 to module 100". Card blank 610 is of like thickness to contacts 114a, 114b, for example, about 75 μm (about 3 mils) each, and has an aperture 614 therethrough into which contacts 114a, 114b fit so as to be exposed and substantially flush with or extending slightly above the surface of card blank 610. Dielectric layer 120 is preferably also of like thickness thereto. Module 100" is coated with a layer 150 of high melt-flowable adhesive (e.g., also of type MB7060 or type MB7100 adhesive) that is of sufficient thickness to encapsulate electronic devices 140, 170, 180, 190 to dielectric substrate 120 and also serves to attach card blank 620 to module 100". Card blank 620 is typically of like thickness to card blank 610 and contacts 114a, 114b, for example, about 75 μm (about 3 mils). Card blanks 610, 620 are of conventional materials, for example, of PVC or polyester, and the like.

The thickness of adhesive layer 150 is selected not only to cover electronic devices 140, 170, 180, 190, but to establish the overall thickness of article 600 at a desired dimension, such as the 0.785 mm (about 31 mil) thickness of standard credit cards, smart cards and the like. Thus an about 535 $\mu$m (about 21-mil) thick layer 150 combines with the three 75-$\mu$m (3-mil) thicknesses of card blanks 610, 620 and of dielectric layer 120, plus the 25-$\mu$m (1-mil) thick adhesive layer 612, for an overall thickness of about 0.785 mm (about 31 mils). Conveniently, these thicknesses are compatible with the height of electronic devices 140. 170, 180, 190, which are about 500 $\mu$m (about 20 mils) or less. The mounted height of each device should preferably be about 400–450 $\mu$m (about 16–18 mils) or less when connected by solder bumps and about 450–500 $\mu$m (about 18–20 mils) when connected by conductive adhesive bumps, which bumps are typically of 70-$\mu$m (3-mil) diameter. For example, a typical 405-$\mu$m (16-mil) thick electronic device attached by 75-$\mu$m (3-mil) conductive bumps has a height of about 480 $\mu$m (19 mils).

While the present invention has been described in terms of the foregoing exemplary embodiments, variations within the scope and spirit of the present invention as defined by the claims following will be apparent to those skilled in the art. For example, conductive vias could be formed by depositing a pattern of electrically-conductive adhesive onto metal contacts 114, either before or after dielectric adhesive layer 120 is deposited thereon, as by screen printing, stencil printing, mask printing or other suitable method. In addition, although electroless and electrolytic plating (electroplating) is preferred, other deposition methods such as chemical plating, immersion coating and the like may be utilized.

What is claimed is:

1. A module having exposed contacts comprising:
    a pattern of sheet metal contacts having a first surface and an exposed second surface;
    a layer of at least one of a B-staged thermoplastic and a cured thermosetting dielectric adhesive on the first surface of said pattern of sheet metal contacts and having at least two holes therethrough to the first surface of said sheet metal contacts;
    at least two electrically-conductive vias substantially filling the holes in said dielectric adhesive layer and including a layer of an oxidation resistant metal contacting the first surface of the sheet metal contacts, each conductive via having an end distal from the first surface of said sheet metal contacts; and
    at least one electronic device having electrical contacts connected to the distal end of said conductive vias.

2. The module of claim 1 wherein said conductive vias comprise metal deposited onto said metal contacts.

3. The module of claim 2 wherein said conductive vias and said metal contacts are formed of the same metal.

4. The module of claim 3 wherein said metal is selected from the group consisting of copper, aluminum, nickel, kovar, alloy 42, beryllium copper, brass, copper-based alloys, iron-based alloys, and combinations and alloys thereof, and laminates thereof.

5. The module of claim 4 further comprising a metal coating on the second surface of said metal contacts and on the distal end of said conductive vias, wherein said metal coating includes at least one of nickel, tin, silver, gold, platinum, palladium, nickel-palladium, nickel-gold, a combination thereof, and an alloy thereof.

6. The module of claim 2 wherein said metal of said conductive vias is plated metal deposited by one of chemical plating, immersion coating, electrolytic plating, and electroless plating.

7. The module of claim 1 wherein said conductive vias comprise electrically-conductive adhesive deposited onto said metal contacts.

8. The module of claim 7 wherein said electrically-conductive adhesive is a flexible adhesive.

9. The module of claim 1 wherein said conductive vias are formed in said holes in said layer of dielectric adhesive.

10. The module of claim 1 wherein the contacts of said electronic device are connected to said conductive vias by a connection selected from the group consisting of electrically-conductive adhesive, solder and wire bonding.

11. The module of claim 1 wherein said electronic device is attached to said dielectric adhesive layer by an insulating adhesive underfill.

12. The module of claim 1 wherein said electronic device is encapsulated on said dielectric adhesive layer by a high melt flow adhesive.

13. The module of claim 1 wherein said electronic device is attached to said dielectric adhesive layer by an insulating adhesive underfill and is encapsulated on said dielectric adhesive layer by a high melt flow adhesive.

14. A contact module having exposed contacts and including at least one electronic device comprising:
    a sheet metal layer having a first surface and an exposed second surface, said sheet metal layer having openings therethrough defining a pattern of at least two exposed sheet metal contacts;
    a layer of at least one of a B-staged thermoplastic and a cured thermosetting dielectric adhesive on the first surface of said sheet metal layer, said dielectric adhesive layer having at least two holes therethrough each to the first surface of one of said at least two sheet metal contacts, respectively;
    at least two electrically-conductive vias substantially filling the at least two holes of said dielectric adhesive layer and including a layer of an oxidation resistant metal contacting the respective first surfaces of the at least two sheet metal contacts, each electrically-conductive via having an end distal from said sheet metal layer; and
    means for connecting at least two contacts of the at least one electronic device each to a respective distal end of one of said electrically-conductive vias.

15. The contact module of claim 14 wherein said electrically-conductive vias comprise metal deposited onto said metal layer.

16. The contact module of claim 15 wherein said electrically-conductive vias and said metal layer are of the same metal selected from the group consisting of copper, aluminum, nickel, kovar, alloy 42, beryllium copper, brass, copper-based alloys, iron-based alloys, and combinations and alloys thereof, and laminates thereof.

17. The contact module of claim 15 wherein said deposited metal of said electrically-conductive vias is deposited by one of chemical plating, immersion coating, electrolytic plating, and electroless plating.

18. The contact module of claim 14 wherein said electrically-conductive vias comprise electrically-conductive adhesive deposited onto said metal layer.

19. The contact module of claim 14 further comprising a metal coating on the second surface of said metal contacts and on the distal end of said electrically-conductive vias, said metal coating including at least one of nickel, tin, silver, gold, platinum, palladium, nickel-palladium, nickel-gold, a combination thereof, and an alloy thereof.

20. The contact module of claim 14 wherein said electrically-conductive vias are formed in the holes in said layer of dielectric adhesive by depositing electrically-conductive adhesive therein.

21. The contact module of claim 14 wherein said electrically-conductive vias are formed in the holes in said layer of dielectric adhesive by depositing metal onto the first surface of said metal contacts therein.

22. The contact module of claim 14 wherein said means for connecting includes connections selected from the group consisting of electrically-conductive adhesive, solder and wire bonding.

23. The contact module of claim 14 further comprising an insulating adhesive underfill attaching said at least one electronic device to said dielectric adhesive layer.

24. The contact module of claim 14 further comprising a high melt flow adhesive encapsulating said electronic device on said dielectric adhesive layer.

25. The contact module of claim 14 further comprising an insulating adhesive underfill attaching said electronic device to said dielectric adhesive layer and a high melt flow adhesive encapsulating said electronic device on said dielectric adhesive layer.

26. A module comprising:
  a pattern of metal foil contacts having a first surface and an exposed second surface;
  a layer of at least one of a B-staged thermoplastic and a cured thermosetting dielectric adhesive on the first surface of said pattern of metal foil contacts and having at least two holes therethrough to the first surface of said metal foil contacts;
  a layer of an oxidation resistant metal on the first surface of said metal foil contacts at least at the locations of the at least two holes;
  at least two electrically-conductive vias substantially filling the holes in said dielectric adhesive layer and contacting the oxidation resistant metal on the first surface of the metal foil contacts, each conductive via having an end distal from the first surface of said metal foil contacts; and
  at least one electronic device having electrical contacts connected to the distal end of said conductive vias.

27. The module of claim 26 wherein said oxidation resistant metal includes at least one of nickel, tin, silver, gold, platinum, palladium, nickel-palladium, nickel-gold, a combination thereof, and an alloy thereof.

28. The module of claim 26 further comprising an oxidation resistant metal coating on the at least one of the second surface of said metal foil contacts and the distal end of said conductive vias, wherein said oxidation resistant metal coating includes at least one of nickel, tin, silver, gold, platinum, palladium, nickel-palladium, nickel-gold, a combination thereof, and an alloy thereof.

29. A module comprising:
  a pattern of metal foil contacts having a first surface and an exposed second surface;
  a layer of at least one of a B-staged thermoplastic and a cured thermosetting dielectric adhesive on the first surface of said pattern of metal foil contacts and having at least two holes therethrough to the first surface of said metal foil contacts;
  a layer of an oxidation resistant metal on the first surface of said metal foil contacts at least at the locations of the at least two holes;
  at least two vias of electrically-conductive adhesive substantially filling the holes in said dielectric adhesive layer and contacting the oxidation resistant metal on the first surface of the metal foil contacts, each conductive via having an end distal from the first surface of said metal foil contacts; and
  at least one electronic device having electrical contacts connected to the distal end of said conductive vias.

30. The module of claim 29 wherein said electrically-conductive adhesive is a flexible electrically-conductive adhesive.

31. The module of claim 29 wherein said oxidation resistant metal includes at least one of nickel, tin, silver, gold, platinum, palladium, nickel-palladium, nickel-gold, a combination thereof, and an alloy thereof.

32. The module of claim 29 further comprising an oxidation resistant metal coating on the at least one of the second surface of said metal foil contacts and the distal end of said conductive vias, wherein said oxidation resistant metal coating includes at least one of nickel, tin, silver, gold, platinum, palladium, nickel-palladium, nickel-gold, a combination thereof, and an alloy thereof.

33. A method for making a module including an electronic device comprising:
  providing a sheet of electrical contact material having first and second surfaces;
  providing an electronic device having a pattern of contacts thereon;
  applying a layer of at least one of a thermoplastic and a thermosetting dielectric adhesive on the first surface of the sheet of electrical contact material except in locations corresponding to locations of electrically-conductive vias, whereby the layer of dielectric adhesive has blind holes to the sheet of electrical contact material in locations corresponding to the locations of electrically conductive vias;
  one of B-staging and curing the layer of dielectric adhesive;
  forming a pattern of electrically-conductive vias on the first surface of the sheet of electrical contact material in the blind holes of the layer of dielectric adhesive, the pattern of electrically-conductive vias corresponding to the pattern of contacts of the electronic device;
  patterning the sheet of electrical contact material to define a pattern of exposed electrical contacts thereon after said one of B-staging and curing the layer of dielectric adhesive, wherein ones of the exposed electrical contacts are associated with at least corresponding ones of the electrically-conductive vias; and
  attaching the electronic device with the contacts of the electronic device electrically connected to corresponding ones of the electrically-conductive vias.

34. The method of claim 33 further comprising encapsulating the electronic device to the layer of dielectric adhesive.

35. The method of claim 34 wherein said encapsulating includes applying a high melt flow adhesive by one of roll coating, screen printing, stenciling and laminating.

36. The method of claim 33 wherein said forming a pattern of electrically-conductive vias precedes said applying a layer of dielectric adhesive.

37. The method of claim 33 wherein said applying a layer of dielectric adhesive precedes said forming a pattern of electrically-conductive vias.

38. The method of claim 33 wherein said forming a pattern of electrically-conductive vias precedes said patterning the sheet of electrical contact material.

39. The method of claim 33 wherein said patterning the sheet of electrical contact material precedes said forming a pattern of electrically-conductive vias.

40. The method of claim 33 wherein said forming a pattern of electrically-conductive vias includes building up metal vias on the first surface of the sheet of electrical contact material.

41. The method of claim 40 wherein said building up includes one of chemical plating, immersion coating, electrolytic plating, and electroless plating.

42. The method of claim 33 wherein said forming a pattern of electrically-conductive vias includes depositing electrically-conductive adhesive vias on the first surface of the sheet of electrical contact material.

43. The method of claim 42 wherein said depositing includes one of roll coating, screen printing, stenciling, mask printing, ink-jet printing and laminating.

44. The method of claim 33 wherein said applying a layer of dielectric adhesive includes applying an electrically-insulating adhesive by one of roll coating, screen printing, stenciling and laminating.

45. The method of claim 33 wherein said patterning the sheet of electrical contact material includes patterning a photoresist on the sheet of electrical contact material and etching the sheet of electrical contact material.

46. The method of claim 33 further comprising coating at least one of the pattern of electrical contacts and the electrically-conductive vias with a metal including at least one of nickel, tin, silver, gold, platinum, palladium, nickel-palladium, nickel-gold, a combination thereof, and an alloy thereof.

47. The method of claim 33 wherein said attaching the electronic device includes applying an electrically-conductive adhesive to the electrically-conductive vias or to the contacts of the electronic device, and positioning the electronic device such that corresponding ones of the electrically-conductive vias and contacts of the electronic device are joined together by the electrically-conductive adhesive.

48. The method of claim 33 further comprising, prior to said forming a pattern of electrically-conductive vias, coating at least the locations corresponding to the locations of electrically-conductive vias on the first surface of the sheet of electrical contact material with an oxidation resistant metal.

49. The method of claim 48 wherein the oxidation resistant metal includes at least one of nickel, tin, silver, gold, platinum, palladium, nickel-palladium, nickel-gold, a combination thereof, and an alloy thereof.

* * * * *